(12) United States Patent
Tsuchiya et al.

(10) Patent No.: US 10,745,289 B2
(45) Date of Patent: Aug. 18, 2020

(54) VANADIUM OXIDE FILM AND PROCESS FOR PRODUCING SAME

(71) Applicant: NATIONAL INSTITUTE OF ADVANCED INDUSTRIAL SCIENCE AND TECHNOLOGY, Tokyo (JP)

(72) Inventors: Tetsuo Tsuchiya, Tsukuba (JP); Haruo Ishizaki, Tsukuba (JP); Tomohiko Nakajima, Tsukuba (JP); Kentaro Shinoda, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/520,339

(22) PCT Filed: Oct. 26, 2015

(86) PCT No.: PCT/JP2015/080110
§ 371 (c)(1),
(2) Date: Apr. 19, 2017

(87) PCT Pub. No.: WO2016/068076
PCT Pub. Date: May 6, 2016

(65) Prior Publication Data
US 2017/0313595 A1  Nov. 2, 2017

(30) Foreign Application Priority Data

Oct. 27, 2014 (JP) ................... 2014-218176

(51) Int. Cl.
| | | |
|---|---|---|
| C01G 31/02 | (2006.01) | |
| C01G 31/00 | (2006.01) | |
| C01G 53/00 | (2006.01) | |
| C01G 49/00 | (2006.01) | |
| H01L 21/02 | (2006.01) | |
| G01J 5/00 | (2006.01) | |

(52) U.S. Cl.
CPC ............ *C01G 31/02* (2013.01); *C01G 31/00* (2013.01); *C01G 49/00* (2013.01); *C01G 53/00* (2013.01); *H01L 21/02565* (2013.01); *H01L 21/02581* (2013.01); *H01L 21/02628* (2013.01); *G01J 5/0003* (2013.01)

(58) Field of Classification Search
CPC combination set(s) only.
See application file for complete search history.

(56) References Cited

U.S. PATENT DOCUMENTS

| | | |
|---|---|---|
| 6,489,613 B1 | 12/2002 | Mori et al. |
| 2001/0028034 A1 | 10/2001 | Sasaki |
| 2002/0139776 A1 | 10/2002 | Tsuchiya et al. |
| 2006/0068218 A1* | 3/2006 | Hooghan ............... B32B 15/01 428/615 |
| 2011/0303847 A1 | 12/2011 | Kurashina et al. |
| 2012/0196150 A1 | 8/2012 | Tsuchiya et al. |
| 2013/0101867 A1 | 4/2013 | Yukinobu et al. |
| 2013/0344335 A1* | 12/2013 | Gao ....................... C01G 31/02 428/402 |
| 2015/0251948 A1 | 9/2015 | Gao et al. |

FOREIGN PATENT DOCUMENTS

| | | |
|---|---|---|
| JP | 38-10172 B2 | 6/1963 |
| JP | 2000-143243 | 5/2000 |
| JP | 3080093 B2 | 8/2000 |
| JP | 2001-247958 | 9/2001 |
| JP | 2002-284529 | 10/2002 |
| JP | 2012-002603 | 1/2012 |

(Continued)

OTHER PUBLICATIONS

Electrical Studies of REactivity Sputtered Fe-doped VO2 thin films; T.E. Phillips; Mat. Res. Bull., vol. 22, pp. 1113-1123 (Year: 1987).*
Nishikawa et al., Ti-Doped VO2 Films Grown on Glass Substrates, Jpn. J. Appl. Phys., 2011, vol. 50, 6 pages.
Phillips et al., Electrical studies of reactively sputtered Fe-doped VO2 thin films, Materials Research Bulletin, 1987, vol. 22, pp. 1113-1123.
Shibuya et al., Metal Insulator transition in epitaxial thin films, Appl. Phys. Lett., 2010, vol. 96, 4 pages.
Tsuzuki et al., Properties of semiconductive glasses in the V2O5—CuO system, Journal of Materials Science Letters, 1988, vol. 7, pp. 757-747.

(Continued)

*Primary Examiner* — Monique R Peets
(74) *Attorney, Agent, or Firm* — Studebaker & Brackett PC

(57) ABSTRACT

Provided is a vanadium oxide film which shows substantially no hysteresis of resistivity changes due to temperature rising/falling, has a low resistivity at room temperature, has a large absolute value of the temperature coefficient of resistance, and shows semiconductor-like resistance changes in a wide temperature range. In the vanadium oxide film, a portion of the vanadium has been replaced by aluminum and copper, and the amount of substance of aluminum is 10 mol % based on the sum total of the amount of substance of vanadium, the amount of substance of aluminum, and the amount of substance of copper. This vanadium oxide film has a low resistivity, has a large absolute value of the temperature coefficient of resistance, and shows substantially no hysteresis of resistivity changes due to temperature rising/falling. This vanadium oxide film is produced by applying a mixture solution containing a vanadium organic compound, an aluminum organic compound, and a copper organic compound to a substrate, calcining the substrate at a temperature lower than the temperature at which the substrate decomposes, and irradiating the surface of the substrate onto which the mixture solution has been applied with ultraviolet light.

9 Claims, 4 Drawing Sheets

(56) References Cited

FOREIGN PATENT DOCUMENTS

| | | |
|---|---|---|
| JP | 2014-505651 A | 3/2014 |
| WO | WO2011/027774 | 3/2011 |

OTHER PUBLICATIONS

International Preliminary Report on Patentability in corresponding International Application No. PCT/JP15/80110 filed Oct. 26, 2015, briefly discussing JP38-10172 as Document 2 on p. 5 of the opinion (8 pages).

* cited by examiner

VANADIUM OXIDE FILM AND PROCESS FOR PRODUCING SAME

CROSS REFERENCE TO RELATED APPLICATIONS

This application is the U.S. National Phase Application under 35 U.S.C. 371 of International Application No. PCT/JP2015/080110, entitled "VANADIUM OXIDE FILM AND PROCESS FOR PRODUCING SAME," filed on 26 Oct. 2015, which claims priority to Japanese Patent Application JP 2014-218176, filed on 27 Oct. 2014, which the contents of these applications are incorporated by reference herein in their entireties.

TECHNICAL FIELD

The present invention relates to a vanadium oxide film which shows substantially no hysteresis of resistivity changes due to temperature rising/falling and has a large absolute value of the temperature coefficient of resistance and to a method of producing the vanadium oxide film.

BACKGROUND ART

Vanadium oxide, which shows semiconductor-like resistance changes, is used as a material for infrared sensors. The absolute value of the temperature coefficient of resistance of vanadium oxide at room temperature is about 2%/° C., and the value becomes smaller as the temperature becomes higher (Patent Document 1). In order to develop compact and high-precision infrared sensors, a material having a large absolute value of the temperature coefficient of resistance is required. Crystallized vanadium oxide undergoes metal-insulator transition at around 68° C., and its electric and optical properties are drastically changed in accordance with this transition. Thus, crystallized vanadium oxide is expected to be applied to infrared sensors which utilize a large change in electric resistance.

However, synthesis of crystallized vanadium oxide generally includes a heating step at 400° C. or more, and when vanadium oxide crystals are synthesized on a substrate containing polyimide resin, the polyimide resin is subjected to pyrolysis. To overcome this problem, Patent Document 2 discloses that a solution of a vanadium organic compound is applied onto a support, dried, and then irradiated with laser light having a wavelength of 400 nm or less in two stages to decompose the vanadium organic compound to thereby enable production of a crystallized vanadium oxide thin film for infrared sensors at a low temperature. The vanadium oxide thus crystallized has metal-insulator transition accompanied by structural phase transition against temperature changes and thus shows a hysteresis of resistivity changes due to temperature rising/falling. In application to infrared sensors, materials showing a hysteresis of resistivity changes due to temperature rising/falling are not preferable.

To overcome this problem, Patent Document 3 discloses that a thin film including an amorphous layer and a crystalline layer is produced by irradiation of laser having a wavelength of 400 nm or less. This thin film is a vanadium oxide resistor film used in infrared sensors and shows metal-insulator transition having substantially no hysteresis. However, this vanadium oxide resistor film has a large absolute value of the temperature coefficient of resistance only around room temperature. Terahertz sensors employing the current infrared sensor device technology have been developed (Patent Document 4). In order to improve the sensitivity of such sensors, a material which shows substantially no hysteresis of resistivity changes and has a large absolute value of the temperature coefficient of resistance has become required.

In order to solve the above problem, control of the metal-insulator transition temperature is required. It has been reported so far that doping vanadium oxide with a metal changes the metal-insulator transition temperature. In a $VO_2$ film doped with Ti, a shift of the metal-insulator transition temperature toward high temperatures and broadening of the metal-insulator transition are observed in accordance with increase in the amount of Ti doped, and simultaneously, reduction in the hysteresis width has been observed (Non-Patent Document 1), but a problem of the high resistivity exists. In vanadium oxide doped only with W, a shift of the metal-insulator transition temperature toward low temperatures is observed, and reduction in the hysteresis width has been observed (Non-Patent Document 2).

In contrast, an oxide thin film for bolometers is known which satisfies $1.5 \leq x \leq 2.0$ when vanadium oxide is represented by $VO_x$ and in which a portion of V is replaced by other metal M, wherein M comprises at least one of chromium (Cr), aluminum (Al), iron (Fe), manganese (Mn), niobium (Nb), tantalum (Ta), and titanium (Ti) (Patent Document 5). In the case of doping with these metals, the temperature coefficient of resistance at room temperature at which the absolute value is maximized is —4.15%/° C. in the case of doping with manganese. However, the absolute value of the temperature coefficient of resistance cannot be expected to increase at a temperature higher than room temperature because temperature-dependent properties of the resistance of vanadium oxide in which a portion of vanadium ions has been replaced by other element show a large slope at 0° C. to 20° C.

Additionally, in case of application of a certain material to infrared sensors, control of the resistance value is also important simultaneously as the temperature coefficient of resistance of this material. The resistance value of the bolometer material at room temperature is desirably about 5 kΩ to 100 kΩ, for example. When the thickness of the bolometer thin film is set to 0.05 μm to 1 μm, the resistivity required from the bolometer material is desirably about 0.025 Ωcm to 10 Ωcm (Patent Document 5). As above described, materials which show substantially no hysteresis of resistivity changes due to temperature rising/falling have a resistivity of 1 Ωcm or less when the thickness of the bolometer thin film is 100 nm, show semiconductor-like resistance changes over a wide temperature range, and have an absolute value of the temperature coefficient of resistance larger than that of vanadium oxide have not been reported.

CITATION LIST

Patent Document

Patent Document 1: Japanese Patent Laid-Open No. 2001-247958
Patent Document 2: Japanese Patent Laid-Open No. 2002-284529
Patent Document 3: International Publication No. WO 2011/27774
Patent Document 4: Japanese Patent Laid-Open No. 2012-2603

Patent Document 5: Japanese Patent Laid-Open No. 2000-143243

Non Patent Document

Non Patent Document 1: M. Nishikawa et al., Jpn. J. Appl. Phys., 50, 01BE04, 2011
Non Patent Document 2: K. Shibuya et al., Appl. Phys. Lett., 96, 022102, 2010

SUMMARY OF INVENTION

Technical Problem

The present invention has been made in view of such situations, and has an object to provide a vanadium oxide which shows substantially no hysteresis of resistivity changes due to temperature rising/falling at room temperature or more, has a low resistivity at room temperature, and has a large absolute value of the temperature coefficient of resistance, for the purpose of application and development to infrared sensors, light control glass, and the like.

Solution to Problem

In order to solve the disadvantages possessed by conventional vanadium oxide films, the present inventors have found a material which shows substantially no hysteresis of resistivity changes due to temperature rising/falling, has a low resistivity at room temperature, has an absolute value of the temperature coefficient of resistance larger than that of vanadium oxide, and shows semiconductor-like resistance changes over a wide temperature range by doping vanadium oxide with nickel, iron, aluminum, and copper especially by a process employing light.

In the vanadium oxide film of the present invention, a portion of vanadium is replaced by one or more metals selected from nickel, iron, and aluminum, and copper. In vanadium oxide film of the present invention, it is preferred that a portion of the vanadium be replaced by aluminum and copper and that the amount of substance of aluminum be 7 to 10 mol % based on the sum of the amount of substance of vanadium, the amount of substance of aluminum, and the amount of substance of copper. In another vanadium oxide film of the present invention, a portion of vanadium is replaced by iron, and the amount of substance of iron is 4.0 to 10 mol % based on the sum of the amount of substance of vanadium and the amount of substance of iron.

In these vanadium oxide films of the present invention, the amount of substance of vanadium is preferably 80 mol % or more and less than 100 mol % based on the sum of the amount of substance of vanadium and the amount of substance of the metals replacing vanadium. Additionally, in these vanadium oxide films of the present invention, it is preferred that the absolute value of the temperature coefficient of resistance be 3%/° C. or more in the temperature range of 0 to 80° C. and that substantially no hysteresis of resistivity changes due to temperature rising/falling be shown in the temperature range of 20 to 100° C. Additionally, in these vanadium oxide films of the present invention, the absolute value of the temperature coefficient of resistance is preferably 5%/° C. or more in a certain temperature region of 20° C. or more.

The method for producing a vanadium oxide film of the present invention includes an application step of applying a mixture solution containing a vanadium organic compound, one or more metal organic compounds containing a metal selected from nickel, iron, and aluminum, and a copper organic compound onto a substrate, and at least one step of a calcining step of calcining the substrate onto which the mixture solution has been applied at a temperature lower than the temperature at which the substrate decomposes, and an ultraviolet light irradiation step of irradiating the surface of the substrate onto which the mixture solution has been applied with ultraviolet light. The infrared sensor of the present invention has the vanadium oxide film of the present invention. The light control glass of the present invention has the vanadium oxide film of the present invention. The light control glass herein is glass which can control the amount of light transmitted and the amount of light reflected by electricity, light, heat, or the like.

Advantageous Effects of Invention

According to the present invention, bolometer films for compact infrared sensors and thin films which can automatically adjust the transmittance of infrared in response to the temperature can be easily obtained at a low cost.

DESCRIPTION OF EMBODIMENT

Figure 1:
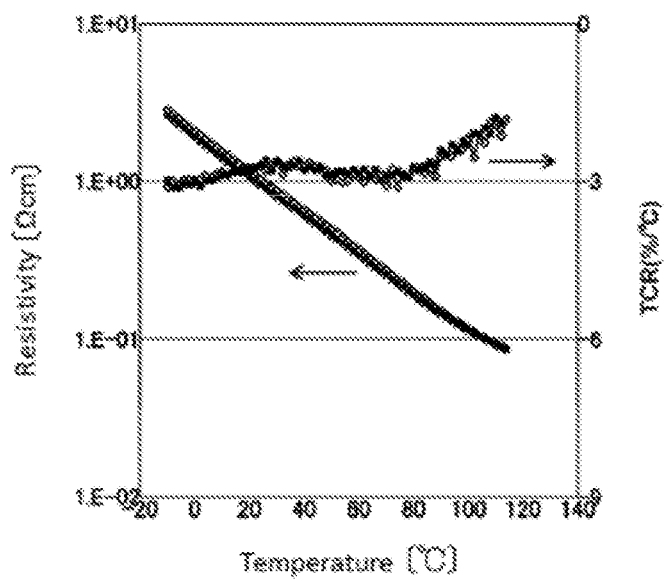
FIG. 1 is a graph showing the relationship between the temperature and the resistivity of the vanadium oxide film of Example 1 (a $VO_x$ film doped with 7 mol % of Cu and 7 mol % of Ni).

Hereinbelow, the vanadium oxide film of the present invention, the method for producing the film, and the product employing the film will be described by way of embodiments and Examples. Duplicate descriptions are omitted as appropriate. The numerical ranges indicated with "to" placed between two numerical values include these two values.

In the vanadium oxide film of the present invention, a portion of vanadium is replaced by one or more metals selected from nickel, iron, and aluminum, and copper. In a vanadium oxide film in which a portion of vanadium is replaced by iron, the amount of substance (so-called molar quantity) of iron is preferably 4.0 to 10 mol % based on the sum of the amount of substance of vanadium and the amount of substance of iron. Alternatively, in a vanadium oxide film in which a portion of vanadium is replaced by aluminum and copper, the amount of substance of aluminum is preferably 7 to 10 mol % based on the total sum of the amount of substance of vanadium, the amount of substance of aluminum, and the amount of substance of copper. This is because the vanadium oxide film satisfying the amount of substance above described shows substantially no hysteresis of resistivity changes due to temperature rising/falling, has a low resistivity at room temperature, has an absolute value of the temperature coefficient of resistance larger than that of vanadium oxide, and shows semiconductor-like resistance changes in a wide temperature range.

Additionally, the vanadium oxide film preferably has an amount of substance of vanadium of 80 mol % or more and less than 100 mol % based on the sum of the amount of substance of vanadium and the amount of substance of the metals replacing vanadium. Additionally, the vanadium oxide film preferably has an absolute value of the temperature coefficient of resistance of 3%/° C. or more in the temperature range of 0 to 80° C. and shows substantially no hysteresis of resistivity changes due to temperature rising/falling in the temperature range of 20 to 100° C. The phrase "shows substantially no hysteresis of resistivity changes due to temperature rising/falling" means that the resistivity at all the temperatures in the temperature falling process is within ±10% of the resistivity at the same temperature in the temperature rising process. Additionally, the absolute value of the temperature coefficient of resistance is preferably 5%/° C. or more in a certain temperature region of 20° C. or more.

The method for producing a vanadium oxide film of the present invention includes an application step of applying a mixture solution containing a vanadium organic compound, one or more metal organic compounds containing a metal selected from nickel, iron, and aluminum, and a copper organic compound onto a substrate, and at least one step of a calcining step of calcining the substrate onto which the mixture solution has been applied at a temperature lower than the temperature at which the substrate decomposes, and an ultraviolet light irradiation step of irradiating the surface of the substrate onto which the mixture solution has been applied with ultraviolet light. Forming a film by a solution process in this manner eliminates use of an expensive vacuum chamber as in a gas phase process to thereby enable cost reduction and simplification of the process. A vanadium oxide film may be produced by forming a film of a metal compound, which is a raw material for the vanadium oxide film, on a substrate by CVD, sputtering, or the like followed by subjecting the resulting substrate to heat treatment and/or light irradiation.

Examples of the organic moiety in the metal organic compounds containing a metal such as vanadium and nickel include β-diketonato, long-chain alkoxides having 6 or more carbon atoms, and organic acid salts which may contain halogen. Specific examples include naphthenates, 2-ethylhexanoates, and acetylacetonatos. Examples of the solvent for the mixture solution include alcohols. To the mixture solution, toluene, xylene, or the like may be added as required. Alternatively, a mixture solution which contains nanoparticles, powder, or the like containing metals to be the raw materials may be used instead of the mixture solution containing organic compounds of metals to be raw materials for the vanadium oxide film.

As the light source used in the ultraviolet light irradiation step, a laser light source or a lamp light source may be used. As the laser light source, harmonics of an excimer laser or a semiconductor laser selected from ArF, KrF, XeCl, XeF, and $F_2$ can be used. As the lamp light source, xenon flash lamps, mercury lamps, metal halide lamps, and excimer lamps are effective. Additionally, in the ultraviolet light irradiation step, it is preferred to conduct laser irradiation at room temperature in the atmosphere because even laser irradiation at room temperature enables crystallization of vanadium oxide, which results in that a wide variety of substrates such as glass and films can be used. Ultraviolet irradiation can be conducted after or while a substrate is calcined at a temperature at which no thermal deformation or the like of the substrate occurs. In order to control the resistance value of the vanadium oxide film, a calcining step in an inert gas atmosphere is effective. Conducting ultraviolet light irradiation in a vacuum chamber as required is also effective from the viewpoint of controlling the resistance value.

Any substrate can be used, as long as a vanadium oxide film can be produced on the surface of the substrate and also the substrate is visible light-transmissive. Any of inorganic substrates such as glass and alumina and organic substrates such as PET and polyimide, for example, can be used. In consideration of application of the vanadium oxide film to light control glass, the substrate is preferably a transparent substrate such as glass. The vanadium oxide film of the present invention, which has a large change in the light transmittance in the infrared region, can be used in light control glass.

EXAMPLES

Hereinbelow, the present invention will be described in detail by way of Examples, but these Examples are not intended to limit the present invention.

Example 1

$V_{0.86}Ni_{0.07}Cu_{0.07}O_x$ Film

First, a dip coating agent for $V_2O_5$ films containing a vanadium organic compound (manufactured by Kojundo Chemical Lab. Co., Ltd., vanadium concentration 0.196 mol/L) (also referred to as "the vanadium solution" hereinbelow), a dip coating agent containing a nickel organic compound (manufactured by the same company, nickel concentration 0.5 mol/L) (also referred to as "the nickel solution" hereinbelow), and a dip coating agent containing a copper organic compound (manufactured by the same company, copper concentration 0.4 mol/L) (also referred to as "the copper solution" hereinbelow) were mixed so as to achieve a molar ratio of V:Ni:Cu=0.86:0.07:0.07 to prepare a precursor solution. Subsequently, the SiN surface of a substrate having a Si layer, a polyimide layer, and a SiN layer in this order was spincoated with this precursor solution.

Then, this substrate was thermally treated at 300° C. for five minutes in the atmosphere to thereby form a thin film on the SiN surface. The solvent in the thin film was removed by this thermal treatment, but the organic compound bonded to the vanadium was not completely removed. Subsequently, this thin film was scan-irradiated with KrF excimer laser light (wavelength 248 nm) under conditions including 30 mJ/cm$^2$, 300° C., 50 Hz, and 40 μm/s to thereby provide the vanadium oxide film of Example 1. The relationship between the temperature, the resistivity, and the temperature coefficient of resistance (TCR) of the vanadium oxide film of Example 1 is shown in FIG. 1. For scale numerical values of each graph, for example, "1.E+02", "1.E+00", and "1.E-02" represent "1×10$^2$", "1×10$^0$", and "1×10$^{-2}$", respectively. The temperature rising process is depicted with ■, and the temperature falling process is depicted with ◇ in each graph. As shown in FIG. 1, the vanadium oxide film of Example 1 had a resistivity at 25° C. of 1 Ωcm, had an absolute value of the temperature coefficient of resistance of 3%/° C. in the wide temperature range of 0 to 80° C., and showed substantially no hysteresis of resistivity changes due to temperature rising/falling.

Comparative Example 1

$V_{0.95}Ni_{0.95}O_x$ Film

Figure 2:
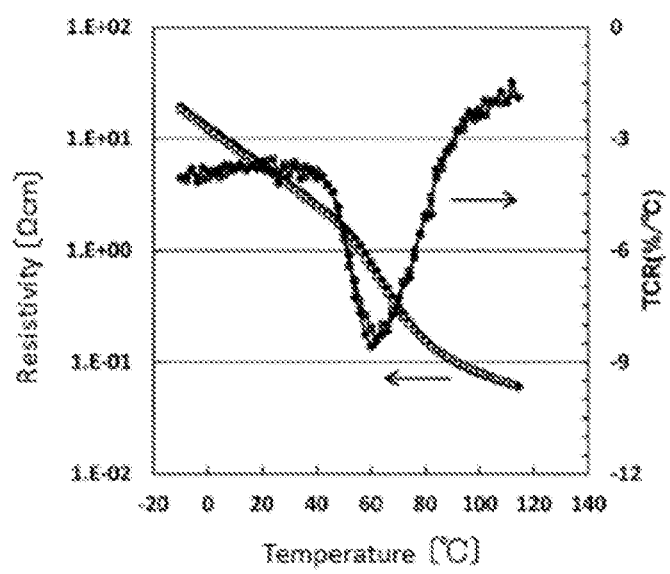
FIG. 2 is a graph showing the relationship between the temperature and the resistivity of the vanadium oxide film of Comparative Example 1 (a $VO_x$ film doped with 5 mol % of Ni).

First, the vanadium solution and the nickel solution were mixed so as to achieve a molar ratio of V:Ni=0.95:0.05 to prepare a precursor solution. Thereafter, the vanadium oxide film of Comparative Example 1 was provided in the same manner as in Example 1. The relationship between the temperature, the resistivity, and the temperature coefficient of resistance of the vanadium oxide film of Comparative Example 1 is shown in FIG. 2. As shown in FIG. 2, the vanadium oxide film of Comparative Example 1 showed substantially no hysteresis of resistivity changes due to temperature rising/falling, but showed resistance as high as a resistivity at 25° C. of 4.28 Ωcm.

Comparative Example 2

$V_{1-y}Cu_yO_x$ (0.02≤y≤0.1) Film

Figure 3:
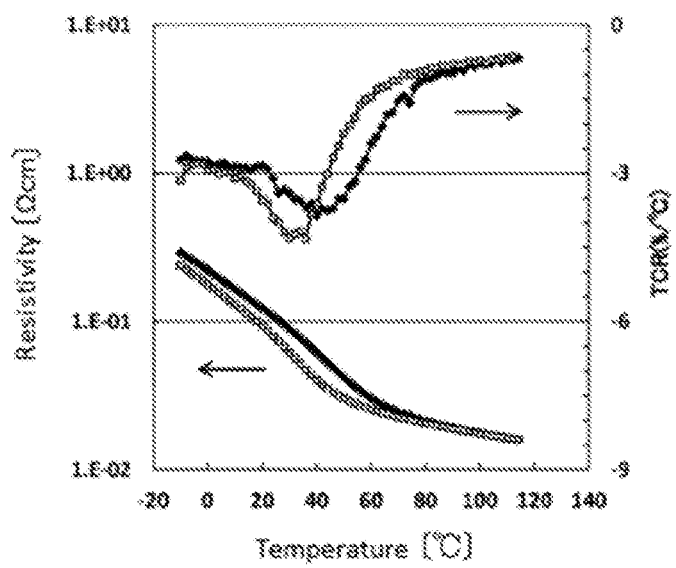
FIG. 3 is a graph showing the relationship between the temperature and the resistivity of the vanadium oxide film of Comparative Example 2-4 ($VO_x$ films doped with 8 mol % of Cu).

First, the vanadium solution and the copper solution were mixed so as to achieve molar ratios of V:Cu=0.9:0.1 to 0.98:0.02 to prepare five precursor solutions. Thereafter, the five vanadium oxide films of Comparative Examples 2-1 to 2-5 (respectively y=0.02, 0.04, 0.06, 0.08, and 0.1) were provided in the same manner as in Example 1. The relationship between the temperature, the resistivity, and the temperature coefficient of resistance of the vanadium oxide ($V_{0.92}Cu_{0.08}O_x$) film of Comparative Example 2-4 is shown in FIG. 3. As shown in FIG. 3, the vanadium oxide film of Comparative Example 2-4 showed a hysteresis of resistivity changes due to temperature rising/falling. Comparative Examples 2-1 to 2-3 and Comparative Example 2-5 also showed a hysteresis of resistivity changes due to temperature rising/falling.

Example 2

$V_{1-z}Fe_zO_x$ (0.04≤z≤0.1) Film

Figure 4:
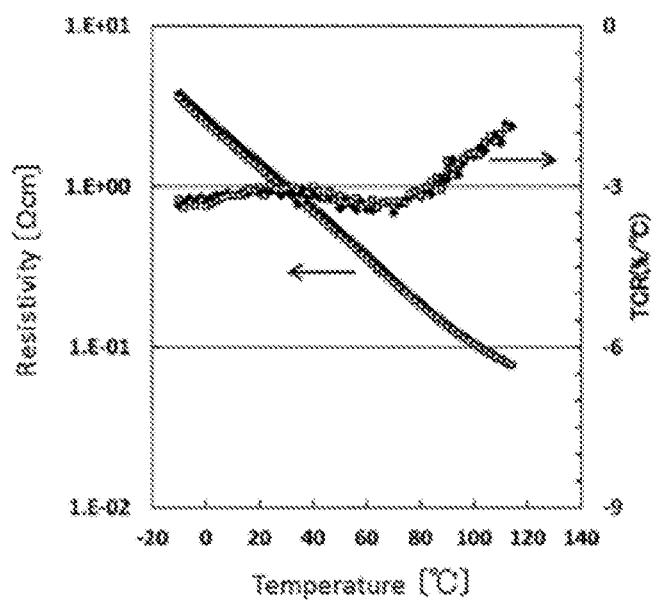
FIG. 4 is a graph showing the relationship between the temperature and the resistivity of the vanadium oxide film of Example 2-4 ($VO_x$ films doped with 10 mol % of Fe).

The vanadium solution and a dip coating agent containing an iron organic compound (manufactured by Kojundo Chemical Lab. Co., Ltd., SYM-FE05, iron concentration 0.4 mol/L) (also referred to as "the iron solution" hereinbelow) were mixed to prepare four precursor solutions. Thereafter, the four vanadium oxide films of Examples 2-1 to 2-4 (z=0.04, 0.055, 0.07, and 0.1) were provided in the same manner as in Example 1. The relationship between the temperature, the resistivity, and the temperature coefficient of resistance of the vanadium oxide ($V_{0.9}Fe_{0.1}O_x$) film of Example 2-4 is shown in FIG. 4. As shown in FIG. 4, the vanadium oxide film of Example 2-4 had a resistivity at 25° C. of 1 Ωcm, had an absolute value of the temperature coefficient of resistance of 3%/° C. in the temperature range of 0 to 80° C., and showed substantially no hysteresis of resistivity changes due to temperature rising/falling. Examples 2-1 and 2-3 also showed substantially no hysteresis of resistivity changes due to temperature rising/falling. Incidentally, the vanadium oxide film having an amount of iron doped less than 4 mol % showed a hysteresis of resistivity changes due to temperature rising/falling.

Example 3

$V_{0.83}Fe_{0.1}Cu_{0.07}O_x$ Film

Figure 5:
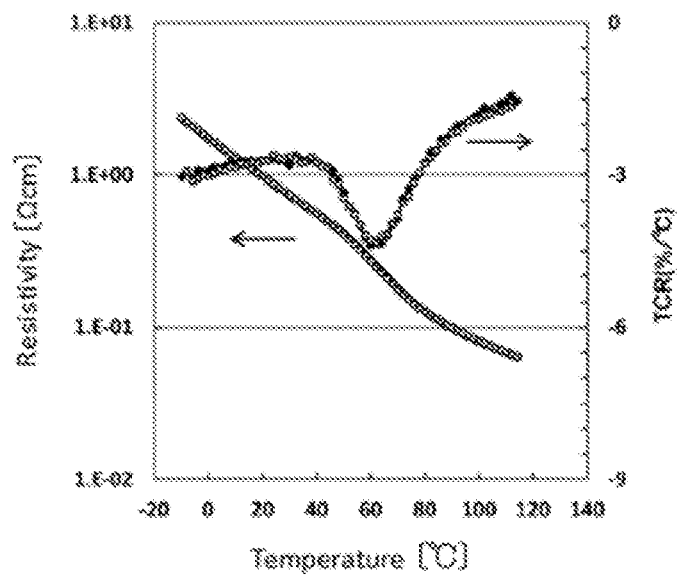
FIG. 5 is a graph showing the relationship between the temperature and the resistivity of the vanadium oxide film of Example 3 (a $VO_x$ film doped with 7 mol % of Cu and 10 mol % of Fe).

First, the vanadium solution, the iron solution, and the copper solution were mixed so as to achieve a molar ratio of V:Fe:Cu=0.83:0.1:0.07 to prepare a precursor solution. Thereafter, the vanadium oxide film of Example 3 was provided in the same manner as in Example 1. The relationship between the temperature, the resistivity, and the temperature coefficient of resistance of the vanadium oxide film of Example 3 is shown in FIG. 5. As shown in FIG. 5, the vanadium oxide film of Example 3 showed substantially no hysteresis of resistivity changes due to temperature rising/falling and had a resistivity at 25° C. of 0.78 Ωcm, which was lower than that of vanadium oxide film of Example 2-4 not doped with copper.

Example 4

$V_{0.86}Al_{0.07}Cu_{0.07}O_x$ Thin Film

Figure 6:
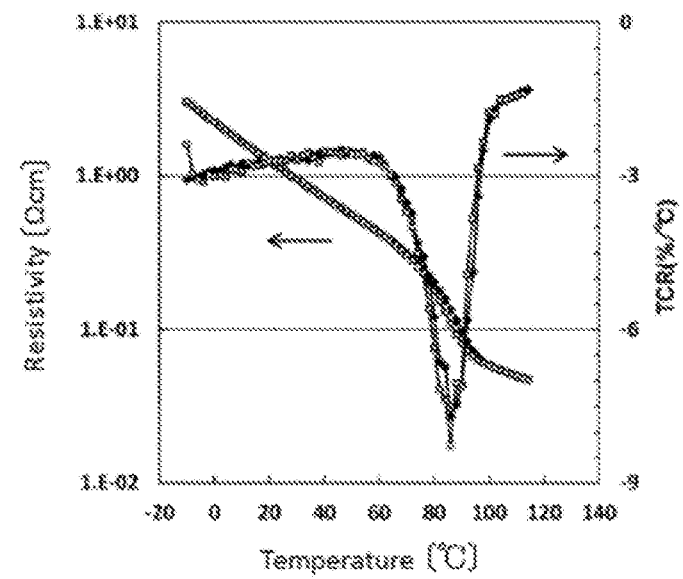
FIG. 6 is a graph showing the relationship between the temperature and the resistivity of the vanadium oxide film of Example 4 (a $VO_x$ film doped with 7 mol % of Cu and 7 mol % of Al).

First, the vanadium solution, a dip coating agent containing an aluminum organic compound (manufactured by Kojundo Chemical Lab. Co., Ltd., SYM-AL04, aluminum concentration 0.4 mol/L) (also referred to as "the aluminum solution" hereinbelow), and a dip coating agent containing a copper organic compound (manufactured by the same company, copper concentration 0.5 mol/L) (also referred to as "the copper solution having a concentration of 0.5 M" hereinbelow) were mixed so as to achieve a molar ratio of V:Al:Cu=0.86:0.07:0.07 to prepare a precursor solution. Thereafter, the vanadium oxide film of Example 4 was provided in the same manner as in Example 1. The relationship between the temperature, the resistivity, and the temperature coefficient of resistance of the vanadium oxide film of Example 4 is shown in FIG. 6. As shown in FIG. 6, the vanadium oxide film of Example 4 had a resistivity at 90° C. of 0.2 Ωcm, had an absolute value of the temperature coefficient of resistance of 7.5%/° C., and showed substantially no hysteresis of resistivity changes due to temperature rising/falling.

Comparative Example 3

$V_{0.93}Al_{0.07}O_x$ Thin Film

Figure 7:
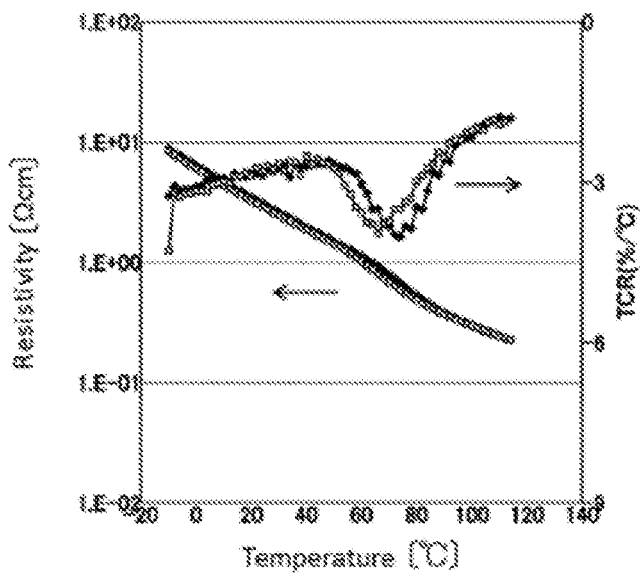
FIG. 7 is a graph showing the relationship between the temperature and the resistivity of the vanadium oxide film of Comparative Example 3 (a $VO_x$ film doped with 7 mol % of Al).

First, the vanadium solution and the copper solution were mixed so as to achieve a molar ratio of V:Al=0.93:0.07 to prepare a precursor solution. Thereafter, the vanadium oxide film of Comparative Example 3 was provided in the same manner as in Example 1. The relationship between the temperature, the resistivity, and the temperature coefficient of resistance of the vanadium oxide film of Comparative Example 3 is shown in FIG. 7. As shown in FIG. 7, the vanadium oxide film of Comparative Example 3 showed a hysteresis of resistivity changes due to temperature rising/falling.

Example 5

$V_{0.03}Al_{0.10}Cu_{0.07}O_x$ Thin Film

Figure 8:
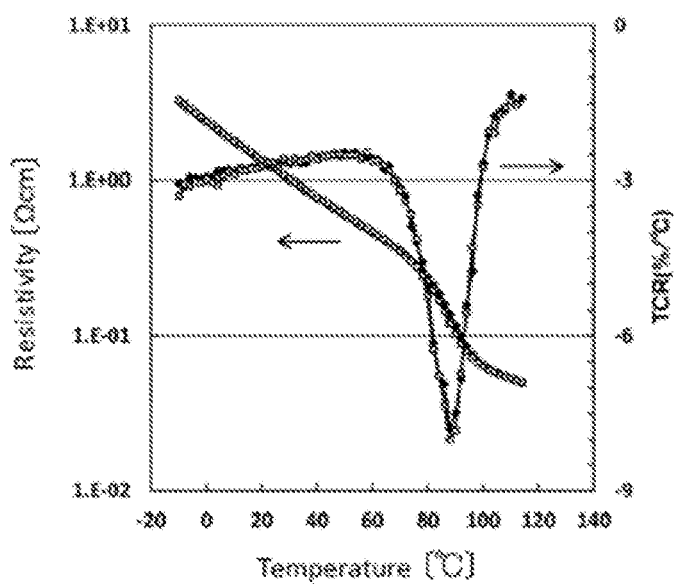
FIG. 8 is a graph showing the relationship between the temperature and the resistivity of the vanadium oxide film of Example 5 (a $VO_x$ film doped with 7 mol % of Cu and 10 mol % of Al).

First, the vanadium solution, the aluminum solution, and the copper solution having a concentration of 0.5 M were mixed so as to achieve a molar ratio of V:Al:Cu=0.83:0.1:0.07 to prepare a precursor solution. Thereafter, the vanadium oxide film of Example 5 was provided in the same manner as in Example 1. The relationship between the temperature, the resistivity, and the temperature coefficient of resistance of the vanadium oxide film of Example 5 is shown in FIG. 8. As shown in FIG. 8, the vanadium oxide film of Example 5 had a resistivity at 90° C. of 0.12 Ωcm, had an absolute value of the temperature coefficient of resistance of 7.8%/° C., and showed substantially no hysteresis of resistivity changes due to temperature rising/falling.

INDUSTRIAL APPLICABILITY

The vanadium oxide film of the present invention shows substantially no hysteresis of resistivity changes due to temperature rising/falling, has a large absolute value of the temperature coefficient of resistance in a wide temperature range, and has a low resistivity at room temperature. Thus, the vanadium oxide film can find applications in highly sensitive infrared sensors, terahertz sensors, and light control glass automatically adjustable by large changes in optical properties in accordance with metal-insulator transition.

What is claimed is:

1. A vanadium oxide film, wherein:
   a portion of vanadium is replaced by:
   one or more metals selected from nickel, iron, and aluminum; and
   copper,
   the amount of substance of vanadium is 80 mol% or more and less than 100 mol% based on the sum of the amount of substance of vanadium and the amount of substance of the metals replacing vanadium, and
   a portion of vanadium is replaced by aluminum and copper, and the amount of substance of aluminum is 7 to 10 mol% based on the total sum of the amount of substance of vanadium, the amount of substance of aluminum, and the amount of substance of copper.

2. A vanadium oxide film, wherein:
   a portion of vanadium is replaced by:
   one or more metals selected from nickel, iron, and aluminum; and
   copper,
   an absolute value of a temperature coefficient of resistance is 3%/° C. or more in a temperature range of 0 to 80° C., and the film shows substantially no hysteresis of resistivity changes due to temperature rising/falling in a temperature range of 20 to 100° C., and
   a portion of vanadium is replaced by aluminum and copper, and the amount of substance of aluminum is 7 to 10 mol% based on the total sum of the amount of substance of vanadium, the amount of substance of aluminum, and the amount of substance of copper.

3. A vanadium oxide film, wherein:
   a portion of vanadium is replaced by:
   one or more metals selected from nickel, iron, and aluminum; and
   copper,
   the absolute value of the temperature coefficient of resistance is 5%/° C. or more in a certain temperature region of 20° C. or more, and
   a portion of vanadium is replaced by aluminum and copper, and the amount of substance of aluminum is 7 to 10 mol% based on the total sum of the amount of substance of vanadium, the amount of substance of aluminum, and the amount of substance of copper.

4. An infrared sensor comprising the vanadium oxide film according to claim 1.

5. Light control glass comprising the vanadium oxide film according to claim 1.

6. An infrared sensor comprising the vanadium oxide film according to claim 2.

7. Light control glass comprising the vanadium oxide film according to claim 2.

8. An infrared sensor comprising the vanadium oxide film according to claim 3.

9. Light control glass comprising the vanadium oxide film according to claim 3.

* * * * *